(12) United States Patent
Huang et al.

(10) Patent No.: US 10,079,471 B2
(45) Date of Patent: Sep. 18, 2018

(54) BONDING INTERFACE LAYER

(71) Applicant: HEWLETT PACKARD ENTERPRISE DEVELOPMENT LP, Houston, TX (US)

(72) Inventors: Xue Huang, Palo Alto, CA (US); Di Liang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/205,789

(22) Filed: Jul. 8, 2016

(65) Prior Publication Data

US 2018/0013260 A1      Jan. 11, 2018

(51) Int. Cl.
| | | |
|---|---|---|
| H01S 5/00 | (2006.01) | |
| H01S 5/026 | (2006.01) | |
| H01L 23/00 | (2006.01) | |
| H01S 5/22 | (2006.01) | |
| H01S 5/02 | (2006.01) | |

(52) U.S. Cl.
CPC .............. *H01S 5/026* (2013.01); *H01L 24/27* (2013.01); *H01L 24/32* (2013.01); *H01L 24/83* (2013.01); *H01S 5/021* (2013.01); *H01S 5/22* (2013.01); *H01L 2224/27452* (2013.01); *H01L 2224/32145* (2013.01); *H01L 2224/32505* (2013.01); *H01L 2224/8301* (2013.01); *H01L 2924/0533* (2013.01); *H01L 2924/0534* (2013.01); *H01L 2924/05341* (2013.01); *H01L 2924/05342* (2013.01); *H01L 2924/3641* (2013.01)

(58) Field of Classification Search
CPC . H01S 5/026; H01S 5/22; H01S 5/021; H01L 24/32; H01L 24/83; H01L 24/27; H01L 2224/32505; H01L 2224/8301; H01L 2924/05341; H01L 2924/05342; H01L 2924/0534; H01L 2224/32145; H01L 2924/3641; H01L 2224/27452
USPC ....................................................... 372/45.01
See application file for complete search history.

(56) References Cited

U.S. PATENT DOCUMENTS

| | | |
|---|---|---|
| 6,492,283 B2 | 12/2002 | Raaijmakers |
| 6,493,476 B2 | 12/2002 | Bendett |
| | (Continued) | |

FOREIGN PATENT DOCUMENTS

| | | |
|---|---|---|
| WO | WO2013066318 A1 | 5/2013 |
| WO | WO2013165376 A1 | 11/2013 |
| | (Continued) | |

OTHER PUBLICATIONS

Office Action, dated Nov. 8, 2016, U.S. Appl. No. 15/141,948, 20 pages.

(Continued)

*Primary Examiner* — Vu A Vu
(74) *Attorney, Agent, or Firm* — Trop, Pruner & Hu, P.C.

(57) ABSTRACT

An example device in accordance with an aspect of the present disclosure includes a first layer and a second layer to be bonded to the first layer. The first and second layers are materials that generate gas byproducts when bonded, and the first and/or second layers is/are compatible with photonic device operation based on a separation distance. At least one bonding interface layer is to establish the separation distance for photonic device operation, and is to prevent gas trapping and to facilitate bonding between the first layer and the second layer.

16 Claims, 3 Drawing Sheets

(56) References Cited

U.S. PATENT DOCUMENTS

| | | | |
|---|---|---|---|
| 6,585,424 | B2 | 7/2003 | Chason |
| 6,706,581 | B1 | 4/2004 | Hou et al. |
| 6,902,987 | B1* | 6/2005 | Tong .................. H01L 21/0206 148/DIG. 12 |
| 7,231,123 | B2* | 6/2007 | Sugita .................. G02B 6/1225 385/129 |
| 7,560,361 | B2* | 7/2009 | Frank ................ H01L 21/76254 257/411 |
| 7,817,881 | B2 | 10/2010 | Li |
| 7,838,314 | B2* | 11/2010 | Choi .................... H01L 51/524 257/E21.259 |
| 7,949,210 | B2 | 5/2011 | Durfee et al. |
| 8,078,018 | B2 | 12/2011 | Mouli |
| 8,372,673 | B2 | 2/2013 | Lee et al. |
| 8,664,087 | B2 | 3/2014 | Chang et al. |
| 8,716,852 | B2 | 5/2014 | Shu et al. |
| 9,018,675 | B2 | 4/2015 | Bedell et al. |
| 9,059,252 | B1 | 6/2015 | Liu |
| 9,240,406 | B2 | 1/2016 | Feng |
| 9,640,531 | B1 | 5/2017 | Or-Bach |
| 2002/0168837 | A1 | 11/2002 | Hsu et al. |
| 2004/0081386 | A1 | 4/2004 | Morse |
| 2004/0152272 | A1 | 8/2004 | Fladre |
| 2006/0035450 | A1 | 2/2006 | Frank et al. |
| 2009/0194152 | A1 | 8/2009 | Liu et al. |
| 2009/0200636 | A1 | 8/2009 | Edelstein |
| 2009/0263076 | A1 | 10/2009 | Mathai |
| 2009/0302415 | A1 | 12/2009 | Mueller |
| 2010/0140739 | A1 | 6/2010 | Kim |
| 2010/0215309 | A1 | 8/2010 | Shubin et al. |
| 2011/0073989 | A1 | 3/2011 | Rong et al. |
| 2011/0293216 | A1 | 12/2011 | Lipson et al. |
| 2012/0002285 | A1* | 1/2012 | Matsuda ................ B82Y 20/00 359/576 |
| 2012/0119258 | A1 | 5/2012 | Liang |
| 2013/0009321 | A1* | 1/2013 | Kagawa ............ H01L 21/76807 257/774 |
| 2013/0155484 | A1* | 6/2013 | Sweatlock ................ G02F 1/23 359/282 |
| 2014/0141546 | A1 | 5/2014 | Cho |
| 2015/0055910 | A1 | 2/2015 | Liang |
| 2015/0140720 | A1* | 5/2015 | Collins .................... G02B 6/13 438/65 |

FOREIGN PATENT DOCUMENTS

| | | |
|---|---|---|
| WO | WO2014021781 A1 | 2/2014 |
| WO | PCTUS2015013605 | 1/2016 |
| WO | WP2016018285 A1 | 2/2016 |

OTHER PUBLICATIONS

Fan et al, "Impact of Interfacial Layer and Transition Region on Gate Current Performance for High-K Gate Dielectric Stack: Its Tradeoff With Gate Capacitance," (Research Paper), Electron Devices, IEEE Transactions on 50.2, Mar. 2003, pp. 433-439.

Ansheng Liu et al., "A High-Speed Silicon Optical Modulator Based on a Metal-Oxide-Semiconductor Capacitor," Nature 427, Feb. 12, 2004, Nature Publishing Group, pp. 615-618.

Jeong, Y-K. et al., "High Quality High-κ MIM Capacitor by Ta2O5/HfO2/Ta2O5 Multi-layered Dielectric and NH3 Plasma Interface Treatments for Mixed-Signal/RF Applications," (Research Paper), VLSI Technology, Digest of Technical Paper, 2004 Symposium on, IEEE, Jun. 15-17, 2004, pp. 222-223.

Kissinger et al., "Void-free silicon-wafer-bond strengthening in the 200-400 ° C. range", Sens. Actuators. A 36, 1993, pp. 149-156.

Li, J., "Wafer Scale Flexible Interconnect Fabrication for Heterogeneous Integration," (Doctoral Dissertation), TU Delft, Delft University of Technology, Oct. 26, 2015, 94 pages.

Liang et al, "Highly efficient vertical outgassing channels for low-temperature InP-to-silicon direct wafer bonding on the silicon-on-insulator substrate", J. Vac. Sci. Technol. B 26 (4), American Vacuum Society, 2008, pp. 1560-1568.

Martijn J.R. Heck et al, "Hybrid Silicon Photonics for Optical Interconnects," IEEE Journal of Selected Topics in Quantum Electronics, Aug. 13, 2010, pp. 1-14.

Xiaonan Chen et al., "Active Transmission Control Based on Photonic-Crystal MOS Capacitor," Photonic Crystal Materials and Devices VI, Jan. 23, 2007, Proc. of SPIE vol. 6480, pp. 1-9.

PCT/ISA/KR, International Search Report, dated Oct. 13, 2016, PCT/US2016/013605, 13 pages.

PCT/ISA/KR, International Search Report, dated Apr. 22, 2015, PCT/US2014/048818, 13 pages.

* cited by examiner

BONDING INTERFACE LAYER

BACKGROUND

Wafer bonding processes can be used to bond materials together to produce various types of devices. Bonding quality can affect characteristics of a device, and can depend on various factors such as interfacial void density, type of materials used, and techniques used to bond materials together.

BRIEF DESCRIPTION OF THE DRAWINGS/FIGURES

DETAILED DESCRIPTION

In wafer bonding technology, two materials can be bonded together. An oxide layer, e.g., SiO2, can be used to enable low-temperature bonding and to avoid large thermal stress. However, gas byproducts, i.e., H2O and H2, which are generated during the bonding process, cause interface voids in the bonded materials that largely lower the bonding yield. For example, the porous oxide SiO2 can be used between two mating materials to be bonded together, but can result in some dangling bonds on the surfaces to be bonded. When bonding, the dangling bonds chemically react to recombine to generate new molecules such as H2O and H2, as follows:

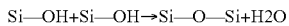
Si—OH+Si—OH→Si—O—Si+H2O

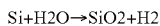
Si+H2O→SiO2+H2

Such outgassing byproducts produced by bonding can be trapped and negatively affect the surfaces being bonded together, forming interface voids in the surfaces. Interface voids reduce bond quality and optical performance. One approach to lower void density in wafer bonding is to create outgassing channels in the material(s) to be bonded, so that outgassing byproducts can pass through the channels. In-plane outgassing channels, and vertical outgassing channels (VOC), can be used to guide the bonding gas byproducts away from the bonding interface, to avoid void formation. However, extra fabrication steps are needed to define and etch the outgassing channels in the material(s) to be bonded. Furthermore, such outgassing channels, vertical or in-plane, occupy space on the materials to be bonded, and such channels need to be spaced apart from each other to be effective. Accordingly, the outgassing channels consume device space that could otherwise be used to form device components, thereby reducing material usage efficiency, lowering device integration density.

To address such issues, example implementations described herein may use one or more bonding interface layers, which may be formed of a dense oxide(s) (e.g., hafnium oxide (HfO2)), to achieve low void density in wafer bonding. Such bonding interface layers/films can be used as the bonding interface between the materials to be bonded, to wafer-bond materials (e.g., hybrid semiconductors) to each other and achieve a high bonding yield, without a need for outgassing channels. Thus, because there is no need to accommodate space for the outgassing channels, devices have more room for components such as waveguides or other photonic/electrical circuits integrated with photonic components.

Figure 1:
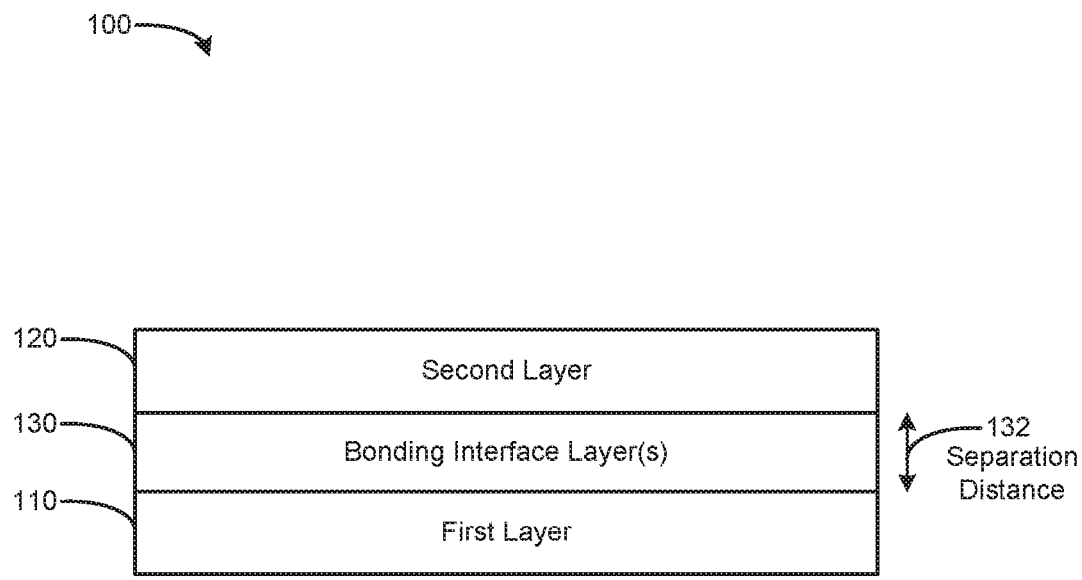
FIG. 1 is a block diagram of a device including at least one bonding interface layer sandwiched between a first layer and a second layer according to an example.

FIG. 1 is a block diagram of a device 120 including at least one bonding interface layer 130 sandwiched between a first layer 110 and a second layer 120 according to an example. The first layer 110 can be a substrate based on materials such as silicon (Si). The first and second layers 110, 120 can be materials that produce outgassing when bonded to each other, such as a Si-on-insulator (SOI) substrate and an Indium phosphide (InP) wafer. The first layer 110 and/or the second layer 120 can be compatible with photonic device operation based on having a separation distance 132 sufficiently thin and unable to accommodate diffusion of outgassed products without degrading bonding process yield and photonic device operation. The bonding interface layer 130 is disposed between the first layer 110 and the second layer 120 to establish the separation distance 132 for photonic device operation, and to avoid gas trapping and facilitate bonding between the first layer 110 and the second layer 120.

The bonding interface layer 130 can be oxides such as HfO2, yttrium oxide (Y2O3), titanium oxide (TiO2), zirconium oxide (ZrO2), and the like to effectively avoid the formation of voids, e.g., to prevent chemical reactions that form H2O molecules that diffuse into the mating materials and generate H2 gas and increase interface pressures resulting in interface void formation. In this manner, examples described herein may provide a film(s) of bonding interface layer(s) 130 on one or both of the facing surface(s) of the first and second layers 110, 120, to facilitate high-quality wafer bonding with a low void density, and a minimum of pre-bonding fabrication (e.g., no need to form outgassing channels in the first/second layers 110, 120). For example, using HfO2 film(s) to provide the bonding interface layer(s) 130 results in very low void density in the bonded wafers of the first/second layers 110, 120.

Such positioning relative to the first and second layers 110, 120, and type(s) of the bonding interface layer(s) 130, enables high quality photonic devices 100 that are efficient to produce. High bonding yields with low void densities are achievable, with efficient fabrication that avoids a need for fabricating in-plane channels or vertical channels for outgassing. Flawless bonding can be achieved by use of the bonding interface layer(s) 130, without a need to use any outgassing channels in layers to be bonded. Furthermore, there is no need for pre-bonding activation steps, such as O2 plasma surface treatment or NH4OH surface activation, in order to obtain flawless bonding results.

A thickness of the bonding interface layer 130 can establish the separation distance 132 between the first and second layers 110, 120, and enable the bonding interface layer(s) 130 to serve as a dielectric and/or facilitate operation of the device 100 as a photonic device. Device operation is enhanced by use of a small separation distance 132. However, in the case of earlier approaches, a reduction of the separation distance 132 would inhibit outgassed products from diffusing away, trapping outgassed products at the bonding interface and exacerbating interface voids. The example implementations described herein, in contrast, rely on the bonding interface layer(s) 130 to prevent gas trapping, and thereby do not suffer from such effects even if the separation distance 132 is reduced, thereby enhancing applicability in photonic applications where a thin separation distance 132 is beneficial, e.g., to minimize optical losses (which loses are exacerbated by interface voids).

The device 100 can be used in photonic applications including those having a III-V device (e.g., formed from the second layer 120) bonded on top of a substrate (e.g., the first layer 110) such as Si. Such devices include lasers, modulators, photodetectors, and the like, having a heightened need for quality bonds that are not negatively affected by interface voids. A thin layer of an oxide such as HfO2, to serve as the bonding interface layer 130 and avoid gas trapping effects, can be used to enhance III-V to silicon integration bonding without a need for a thick separation distance 132. In an example implementation, InP-based semiconductor layers (e.g., light-emitting materials) can be transferred/bonded onto silicon substrates for larger scale production, reducing chip cost.

In some example implementations, a separation distance 132 provided by the bonding interface layer(s) 130 can be on the order of from 1 nanometer (nm) to tens or hundreds of nm. In a particular example implementation, a HfO2 bonding interface layer thickness can be on the order of 6 nm (or 12 nm total thickness, by applying a 6 nm bonding interface layer to each of the two facing surfaces), to provide a dielectric property compatible with providing desirable optical performance. In an alternate example implementation, a HfO2 layer can be used to provide a separation distance 132 of less than 1000 nanometers (nm). This enables the bonding interface layer 130 to be sufficiently thin to provide acceptable optical losses, high coupling efficiency of light from the second layer(s) to the first layer(s), without preventing photonic device operation, Such a small separation distance 132 would, absent the beneficial effects provided by the bonding interface layer 130, suffer excessive optical loss due to interface void formation from gas trapping.

The bonding interface layer 130 can serve as a high dielectric constant (e.g., a high-k dielectric) for photonic device operation. As used herein, a value of k can be considered high or low relative to the dielectric constant of silicon dioxide, which is on the order of 3.9. Accordingly, dielectric constants greater than silicon dioxide (3.9) can be considered high-k.

The bonding interface layer 130 is illustrated as a single layer. However, the illustrated layer can be formed by applying layers/films of the bonding interface to both surfaces to be bonded. In example implementations, the use of two bonding interface layers 130 (for each of the first and second layers 110, 120) provides enhanced protection, where both surfaces are protected by the bonding interface layers 130. The first and/or second layers 110, 120 can include structures, such as a trench, that benefit from protective layers (e.g., to prevent chemicals/gases from diffusing into and potentially reacting with the underlying materials of the first and/or second layers 110, 120. As illustrated, a single layer of bonding interface 130 can be provided on at least one of the first or second layer 110, 120.

Figure 2:
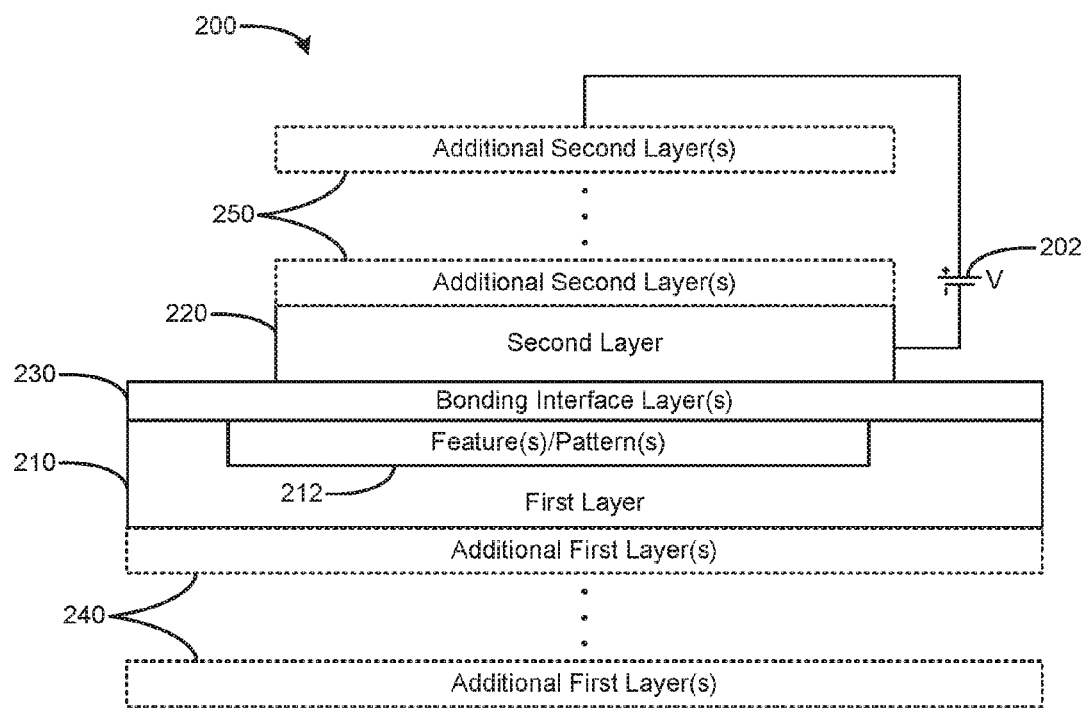
FIG. 2 is a block diagram of a device including at least one bonding interface layer sandwiched between a first layer and a second layer according to an example.

FIG. 2 is a block diagram of a device 200 including at least one bonding interface layer 230 sandwiched between a first layer 210 and a second layer 220 according to an example. Additional first layer(s) 240 can be disposed on the first layer 210. The first layer 210 can include feature(s)/pattern(s) 212, e.g., optical components that can interact optically with the second layer 220. The second layer 220 can include additional second layer(s) 250. A voltage source 202 can be included, e.g., to apply power to the device formed by the second layer 220 and the additional second layer(s) 250.

The device 200 can operate as a photonic device based on the first layer(s) 210, 240, the second layer(s) 220, 250, and/or a combination of first and/or second layer(s). In an example implementation, the second and additional second layer(s) 220, 250 can provide an active optical device, bonded the first and additional first layer(s) 210, 240, enabling more efficient manufacture overall, Such photonic devices can include lasers, amplifiers, optical modulators, photodetectors, optical circulators, optical isolators, optical parametric oscillators, and the like. Lasers include semiconductor lasers (e.g., III-V material based lasers, II-VI material based lasers, Ge material based lasers, quantum cascade lasers), solid state lasers (e.g., Nd:YAG, Nd:YVO4), and the like.

The first and additional first layer(s) 210, 240, and second and additional second layer(s) 220, 250, can include various materials, such as Si, Ge, SiC, SiGe, SiGeC, GeSn, SiOx/Si, Si/SiOx/Si, Si/SiNx/SilnAs, InP, GaAs and other III-V or II-VI compound semiconductors, as well as metals. A given layer 210, 240, 220, 250 can include layered semiconductors, such as Si/SiGe, silicon-on-insulators (SOis) or silicon germanium-on-insulators (SGOis), III-V-based photodetector, III-V based optical modulator, and III-V-based quantum well or quantum dot laser.

The various layers may be chosen for their behavior and properties for providing desirable optical properties for opto-electronic devices, and are therefore not limited to having characteristics that might optimize MOS, memory devices, or otherwise providing electrical properties. In some example implementations, the layers can be compatible with providing low optical absorption for efficient optical device operations. Accordingly, example implementations of device 200 are compatible with applications such as photonic interconnects, optical sensors, sensing, photonic applications, optics, spectroscopic applications, and the like. The second layer 220, and additional second layers 250, can form a photonic device such as a laser structure, including an active region (gain medium), cladding layers, highly doped contact layers, and the like.

Depending on the desired device functions, the second layer(s) 220, 250 can be processed into suitable shapes, including straight ridges, rings, and mesas. Thus, the second layer(s) 220, 250 can serve as one or more layer(s) in a photonic device such as a laser. In an example implementation, the second layer(s) 220, 250 are formed as a mirroring, which can optically interact with the features/patterns 212 of the first layer 210 (e.g., a waveguide formed in the first layer 210). The second layer(s) 220, 250 can be formed in other shapes, such as the second layer including ridges.

The first layer(s) 210, 240 also can include features, such as a gap(s) for optical mode confinement in the first layer 210, and/or patterning to serve as an optical waveguide and/or optical grating. The first layer(s) 210, 240 can thereby interact optically with the second layer(s) 220, 250, at least in part due to the benefits provided by the bonding interface layer(s) 230. For example, by providing, via the bonding interface layer(s) 230, a small separation distance caused by the bonding interface layer(s) 230 sandwiched between the first and second layers 210, 220, and by preventing interface voids due to bonding of layers. The features/patterns 212 can be patterned into the first layer 210 before deposition of the bonding interface layer 230 onto the first layer 210, and before subsequent wafer bonding between the first layer 210 and the second layer 220.

Although not specifically illustrated, optical mode(s) can arise in optical devices (e.g., formed by the second layer(s) 220, 250), and extend beyond a given layer that is used to generate the optical mode(s) (e.g., extend through the bonding interface layer(s) 230 to the first layer 210). Thus, the bonding interface layer(s) 230 provide low optical absorption loss and high coupling efficiency for optical modes that overlap layer 210, thereby enhancing photonic performance.

Figure 3:
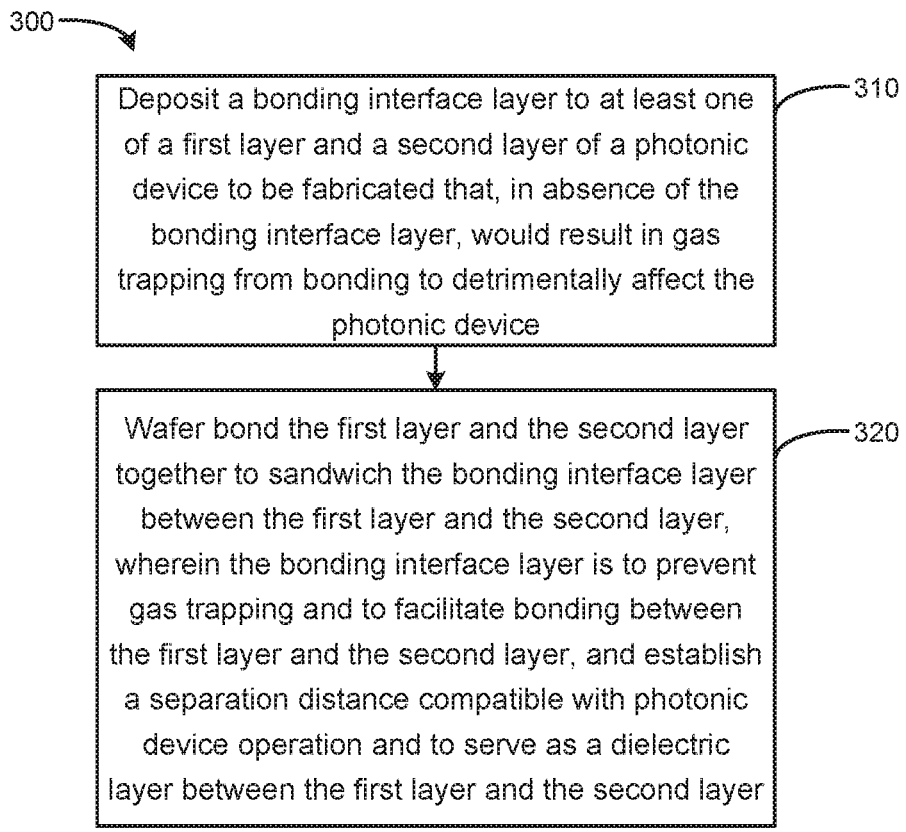
FIG. 3 is a flow chart based on bonding a first layer and a second layer together to sandwich at least one bonding interface layer according to an example.

Referring to FIG. 3, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 3 is a flow chart 300 based on bonding a first layer and a second layer together to sandwich a bonding interface layer according to an example. In block 310, a bonding interface layer is deposited to at least one of a first layer and a second layer of a photonic device to be fabricated. The photonic device would, in absence of the bonding interface layer, produce gas trapping from bonding to detrimentally affect the photonic device. For example, the bonding interface layer is able to prevent the detrimental effects of gas trapping without needing to be so thick as to interfere with providing desirable characteristics (e.g., high light coupling efficiency between mating materials or low optical losses) for photonic operation. In block 320, the first layer and the second layer are wafer bonded together to sandwich the bonding interface layer between the first layer and the second layer. The bonding interface layer is to prevent gas trapping and to facilitate bonding between the first layer and the second layer, and establish a separation distance compatible with photonic device operation and to serve as a dielectric layer between the first layer and the second layer. For example, first film of HfO2 can be deposited on the first layer, and a second film of HfO2 can be deposited on the second layer. Such films not only facilitate bonding, but also serve to protect the underlying structures of the first and second layers.

What is claimed is:

1. A device comprising:
a first layer formed of a silicon (Si)-based material;
a second layer to be bonded to the first layer, wherein the first and second layers are materials that cause gas byproduct trapping when bonded, and wherein the second layer includes an optical component to interact with the first layer to perform a photonic device operation; and
a bonding interface layer that establishes a separation distance of less than 1,000 nanometers between the first and second layers for the photonic device operation, the bonding interface layer disposed between the first layer and the second layer to prevent void formation and to facilitate bonding between the first layer and the second layer, wherein the bonding interface layer includes a material selected from the group consisting of HfO2, Y2O3, and ZrO2 and serves as a high dielectric constant material for the photonic device operation.

2. The device of claim 1, wherein the optical component of the second layer comprises a photonic laser.

3. The device of claim 1, wherein the second layer is formed as a microring.

4. The device of claim 1, wherein the second layer is formed to include a straight ridge shape.

5. The device of claim 1, wherein the first layer includes a feature for optical mode confinement, to interact optically with the second layer.

6. The device of claim 1, wherein the first layer includes a pattern providing an optical waveguide to interact optically with the second layer.

7. The device of claim 1, wherein the first layer includes a pattern providing an optical grating to interact optically with the second layer.

8. The device of claim 1, wherein the bonding interface layer comprises a dielectric having a dielectric constant greater than 3.9.

9. The device of claim 1, further comprising another bonding interface layer between the first layer and the second layer, wherein the bonding interface layer and the another bonding interface layer establish the separation distance of less than 1,000 nanometers.

10. The device of claim 1, wherein the bonding interface layer is to facilitate the bonding between the first layer and the second layer without performing a plasma treatment.

11. A photonic device comprising:
a first layer including a feature to provide optical interaction;
a second layer to be bonded to the first layer, wherein the second layer includes an optical component to interact with the first layer to perform a photonic device operation based on optical interaction with the feature of the first layer; and
a bonding interface layer disposed between the first layer and the second layer to prevent void formation and to facilitate bonding between the first layer and the second layer, wherein the bonding interface layer establishes a separation distance of less than 1,000 nanometers between the first layer and the second layer for the photonic device operation, and wherein the bonding interface layer includes a material selected from the group consisting of HfO2, Y2O3, and ZrO2 and serves as a high dielectric constant material for the photonic device operation.

12. The photonic device of claim 11, wherein the feature of the first layer comprises an optical waveguide.

13. The photonic device of claim 11, further comprising another bonding interface layer between the first layer and the second layer, wherein the bonding interface layer and the another bonding interface layer establish the separation distance of less than 1,000 nanometers.

14. The photonic device of claim 11, wherein the bonding interface layer is to facilitate the bonding between the first layer and the second layer without performing a plasma treatment.

15. A method comprising:
depositing a bonding interface layer to at least one of a first layer and a second layer of a photonic device to be fabricated; and
wafer bonding the first layer and the second layer together to sandwich the bonding interface layer between the first layer and the second layer, wherein the bonding interface layer prevents void formation and facilitates bonding between the first layer and the second layer, and the bonding interface layer establishes a separation distance of less than 1,000 nanometers between the first layer and the second layer, and serves as a dielectric layer between the first layer and the second layer, and wherein the bonding interface layer includes a material selected from the group consisting of HfO2, Y2O3, and ZrO2 and serves as a high dielectric constant material for a photonic device operation of the photonic device including the first layer and the second layer.

16. The method of claim 15, further comprising patterning the first layer, prior to depositing the material of the bonding interface layer on the first layer, to create a feature in the first layer that is to optically interact with the second layer to provide the photonic device operation.

\* \* \* \* \*